United States Patent [19]

Boccuzzi et al.

[11] Patent Number: 5,602,877
[45] Date of Patent: Feb. 11, 1997

[54] METHOD AND APPARATUS FOR INFORMATION RECOVERY IN A RADIO COMMUNICATION DEVICE

[75] Inventors: Joseph Boccuzzi, Brooklyn, N.Y.; Clinton C. Powell, II, Lake Worth, Fla.

[73] Assignee: Motorola, Inc., Schaumburg, Ill.

[21] Appl. No.: 520,322

[22] Filed: Aug. 28, 1995

[51] Int. Cl.⁶ .............................. H03D 3/00; H04L 27/22
[52] U.S. Cl. ............................................ 375/336; 329/300
[58] Field of Search ....................... 375/272, 274, 375/322, 334, 336; 329/300, 304; 455/296, 304, 205

[56] References Cited

U.S. PATENT DOCUMENTS

| | | | |
|---|---|---|---|
| 4,944,025 | 7/1990 | Gehring et al. | 455/207 |
| 4,979,230 | 12/1990 | Marz | 455/3 |
| 5,003,621 | 3/1991 | Gailus | 455/209 |
| 5,309,483 | 5/1994 | Oliboni et al. | 375/355 |
| 5,448,594 | 9/1995 | Huang et al. | 375/336 |

*Primary Examiner*—Stephen Chin
*Assistant Examiner*—Kevin Kim
*Attorney, Agent, or Firm*—Kelly A. Gardner

[57] ABSTRACT

A radio communication device (100) for recovering information from a received signal includes a demodulator (110) for demodulating the received signal into in-phase (I) and quadrature (Q) components and a multiplier (115) for multiplying the I and Q components together to generate a multiplied waveform. A polarity detector (125) coupled to the multiplier (115) determines from the multiplied waveform a polarity variable indicative of a data symbol, and a processor (135) recovers the information from the received signal in accordance with the data symbol.

14 Claims, 3 Drawing Sheets

METHOD AND APPARATUS FOR INFORMATION RECOVERY IN A RADIO COMMUNICATION DEVICE

FIELD OF THE INVENTION

This invention relates in general to radio communication and more specifically to symbol detection in a radio communication device.

BACKGROUND OF THE INVENTION

Radio communication devices, such as paging receivers, conventionally receive a radio signal and demodulate the signal to recover the information therein. Generally, the radio signal is processed to recover in-phase (I) and quadrature (Q) signal components. These signal components are then provided to circuitry for generating a digital output, e.g., a data symbol, representative of the information included in the radio signal. The circuitry conventionally includes elements such as lowpass filters, decimating filters, channel filters, loop filters, and discriminators. This number of elements, however, increases the chance of erroneous processing due to tolerances and hardware failure.

Thus, what is needed is an improved method and apparatus for recovering information in a radio signal.

DESCRIPTION OF A PREFERRED EMBODIMENT

Figure 1:
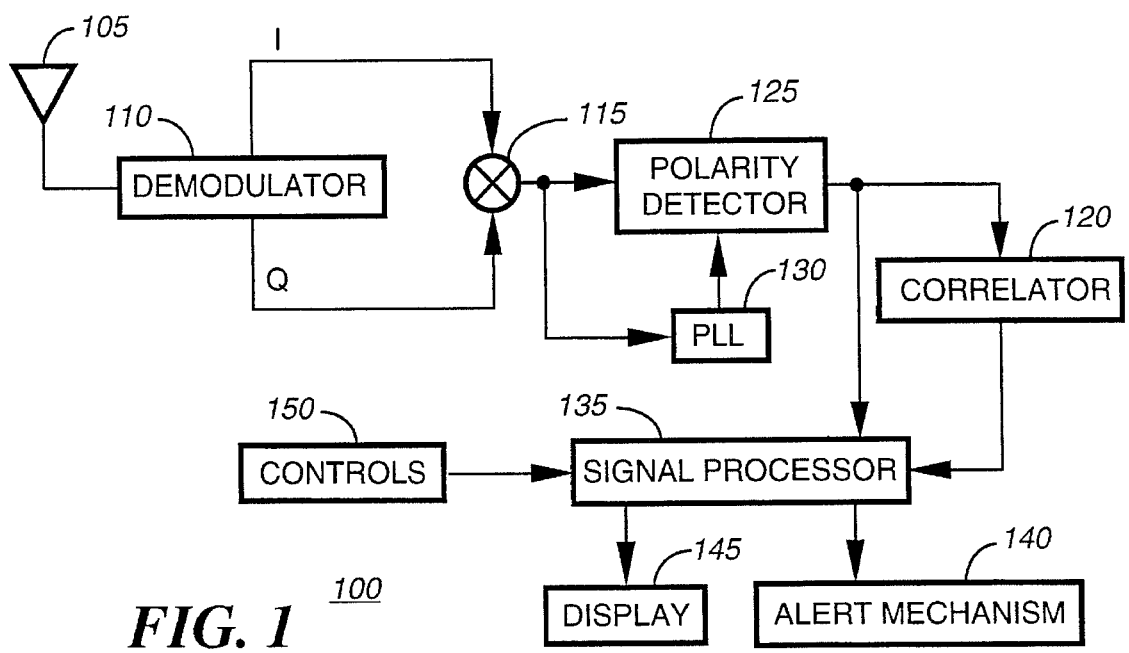
FIG. 1 is an electrical block diagram of a radio communication device according to the present invention.

FIG. 1 is an electrical block diagram of a radio communication device 100 comprising an antenna 105 for receiving a radio signal and a demodulator 110 for demodulating the received radio signal to generate in-phase (I) and quadrature (Q) signal components, or I and Q channels, in a manner well known to one of ordinary skill in the art. Thereafter, the I and Q channels are multiplied together by a multiplier 115. The multiplied waveform is provided to a polarity detector 125 for generating data symbols from the multiplied waveform. The polarity detector 125 is preferably coupled to a conventional phase locked loop (PLL) 130 for providing a reference signal that is referenced by the polarity detector 125 to sample the multiplier waveform at centers of transmitted data symbols. The polarity detector output is preferably provided to a conventional correlator 120 for determining from the synchronization word, i.e., a predetermined symbol pattern, whether the demodulated signal is inverted 180° out of phase.

The correlator output and the data symbols, such as zeros and ones in a two level signalling system, generated by the polarity detector 125 are processed by a signal processor 135 to recover information in accordance with the generated data symbols. When information has been recovered, an alert mechanism 140 is activated by the processor 135 to announce reception to a user. Subsequent manipulation of user controls 150 results in the presentation of the recovered information on a display 145 or other presentation device responsive to a user-initiated display command.

Figures 2, 3, 4, 5:
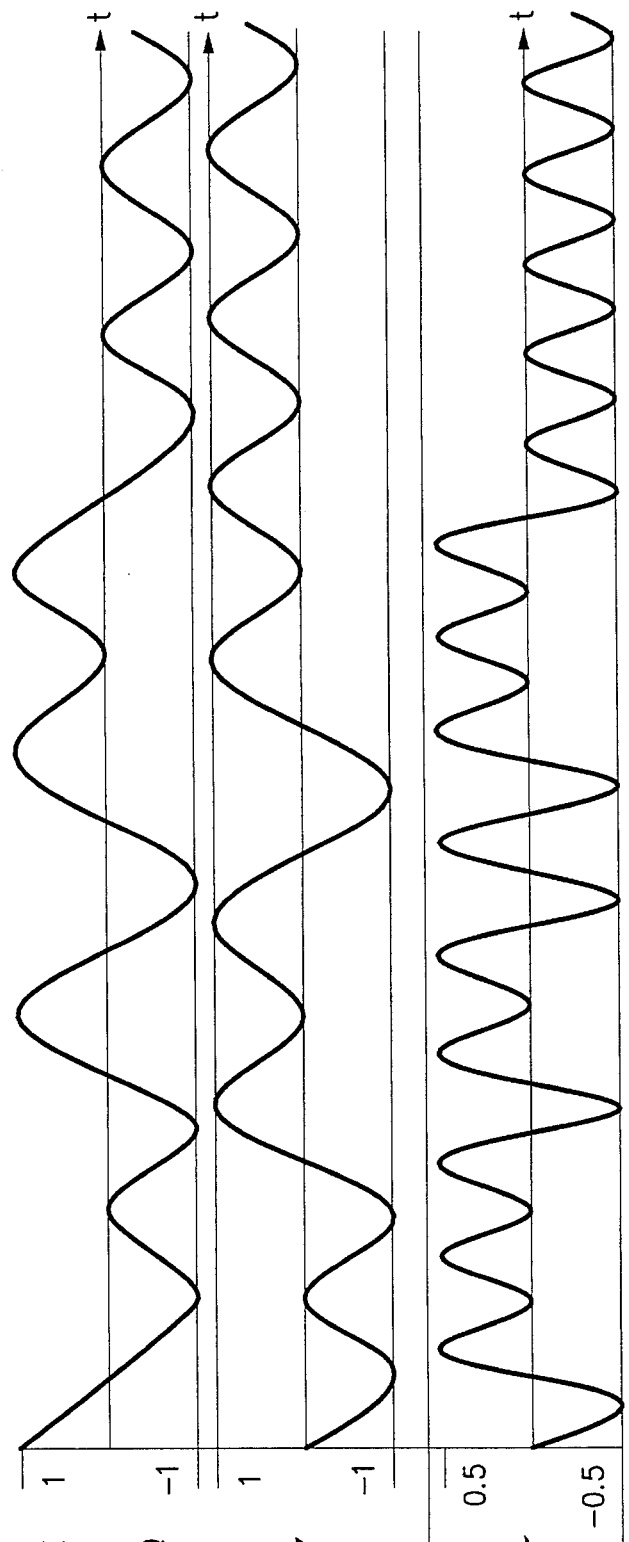
FIGS. 2–5 are signal diagrams of signals processed by the radio communication device of FIG. 1 according to the present invention.

FIGS. 2–5 are signal diagrams of signals processed by the radio communication device 100. FIG. 2 is an example of transmitted symbols. When the transmitted signal is a conventional minimum shift key (MSK) signal, the modulation index, $\beta$, is equal to 0.5. Therefore, the number of cycles per bit is equal to $\beta/2$, and it will be appreciated that the waveforms of FIGS. 3 and 4 are characterized by a quarter cycle per bit. FIGS. 3 and 4 are signal diagrams illustrating the I and Q channels, respectively, generated by the demodulator 110 from the received MSK signal. FIG. 5 illustrates the output of the multiplier 115 when the I and Q channels of FIGS. 3 and 4 are multiplied together. According to the present example, the amplitude of the multiplied waveform of FIG. 5 varies between positive and negative one-half of the I and Q voltage, neglecting losses due to the multiplier 115. In the current example, the amplitude varies between +0.5 volts and −0.5 volts. The multiplication of the I and Q channels effectively doubles the number of cycles per bit to 0.5. In the multiplied waveform, a pattern develops. The pattern suggests that, if a present bit is of the same polarity as the previous bit, then the polarity of the present one-half cycle waveform is the opposite of the previous one. Additionally, if the present binary bit is of the opposite polarity as the previous one, then the polarity of the present one-half cycle waveform is the same as that of the previous one.

Figure 6:
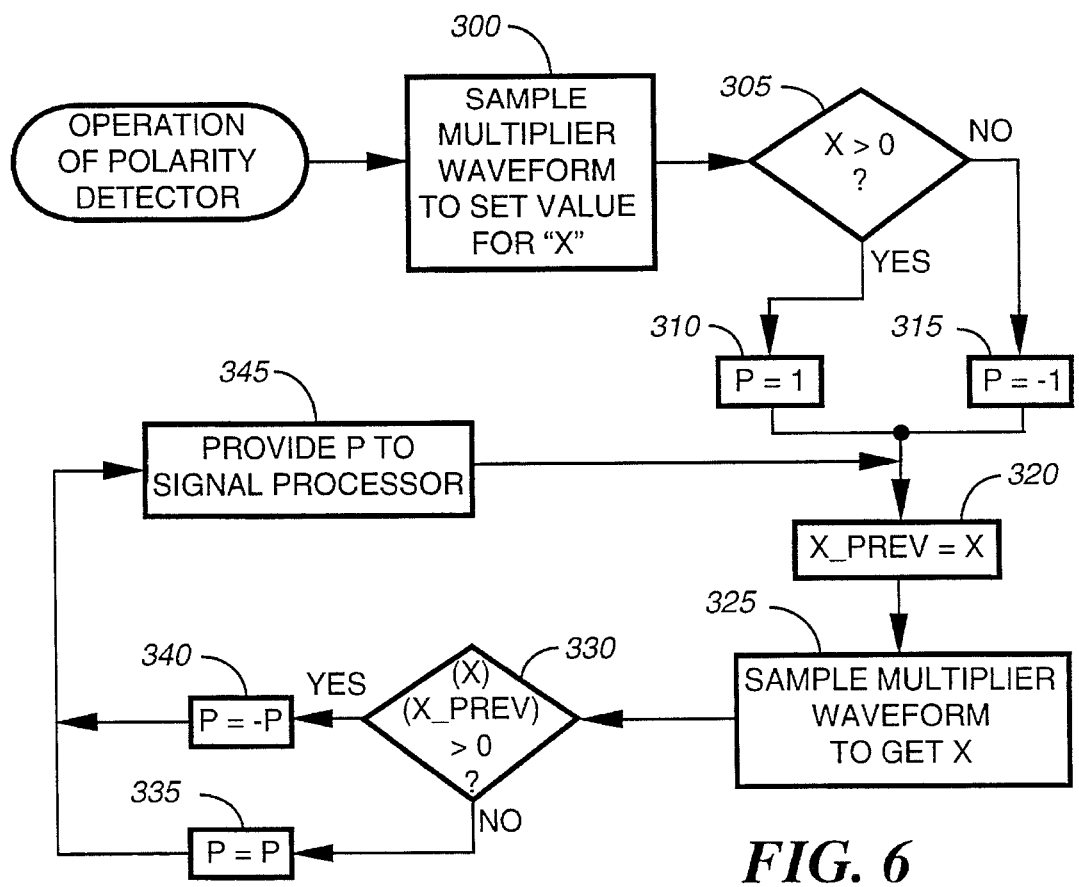
FIG. 6 is a flowchart depicting the operation of a polarity detector included in the radio communication device of FIG. 1 according to the present invention.

Referring next to FIG. 6, a flowchart illustrates the operation of the polarity detector 125, which, in accordance with the present invention, generates data symbols from the multiplied waveform of FIG. 5. At steps 300 to 315, the polarity detector 125 is initialized. Specifically, at step 300, the multiplier waveform is sampled to set a current value x which represents the level, i.e., high or low level, or phase of the sampled point. When, at step 305, x is greater than zero, a polarity variable P is set to one, i.e., P=1, at step 310. When, at step 305, x is not greater than zero, P is set to negative one, i.e., P=−1, at step 315. Thereafter, at step 320, a previous value, x_prev, is set to equal x. At step 325, the multiplier waveform is sampled to set a new value for x. When, at step 330, the product of multiplying x and x_prev is greater than zero, i.e., when the multiplied value is greater than zero, the sign of P is inverted, at step 340. In other words, P is multiplied by negative one (−1). When, at step 330, the product of x times x_prev is not greater than zero, the value of P remains unchanged. Next, at step 345, the variable P is provided to the signal processor 135.

The value of the variable P generated by the polarity detector 125 varies between positive one (+1), which represents a high data symbol, and negative one (−1), which represents a low data symbol. These data symbols are generated by the polarity detector 125, which can easily be implemented through use of the software embodiment illustrated in the flowchart of FIG. 6. Therefore, the radio communication device 100 according to the present invention does not require the inclusion of various hardware filters and discriminators that are necessary in prior art devices. As a result, the radio communication device 100 can be smaller and less expensive than prior art devices. Additionally, the likelihood of erroneous results because of hardware failure or tolerances is reduced in the radio communication device 100.

The signal processor 135, as mentioned above, receives both the correlator output and the polarity detector output.

As mentioned above, the correlator 120 provides an indicator of whether the multiplied waveform is inverted. When the processor 135 determines from the indicator that the multiplier waveform is inverted, the output provided by the polarity detector 125 can be simply inverted to avoid erroneous information recovery. In other words, when the multiplier waveform is inverted, a positive one (+1) from the polarity detector 125 represents a low data symbol while a negative one (−1) represents a high data symbol.

Figure 7:
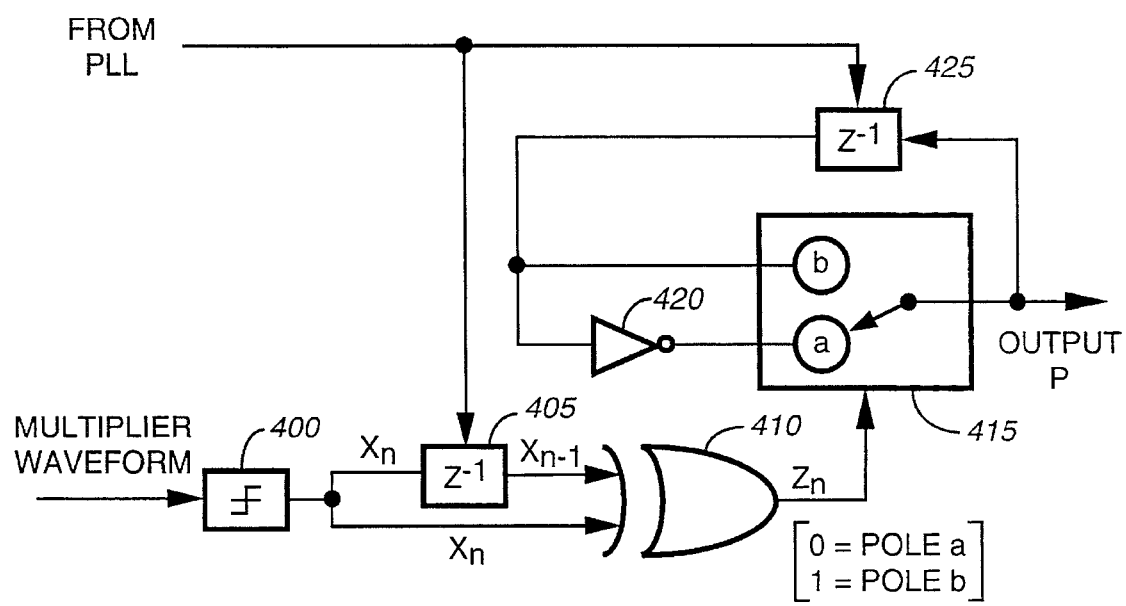
FIG. 7 is a circuit diagram of an embodiment of the polarity detector included in the radio communication device of FIG. 1 according to the present invention.

FIG. 7 is a circuit diagram of a hardware embodiment of the polarity detector 125. The hardware polarity detector 125 preferably comprises a hard limiter 400 coupled to the output of the multiplier 115 (FIG. 1) for limiting the multiplier output to generate a limited output, $x_n$. The output of the hard limiter 400 is provided to a delay circuit 405 for delaying the hard limiter output by one sample, i.e., one symbol time, in accordance with a signal provided by the PLL 130, thereby generating a delayed output, $x_{n-1}$. The output $x_n$ of the hard limiter 400 and the output $x_{n-1}$ of the delay 405 are provided to the inputs of an exclusive-or gate 410, which generates a switch indication value. The hardware polarity detector 125 further comprises a switch 415 coupled to the output of the exclusive-or gate 410 for coupling one of two possible switch indication values to the signal processor 135 (FIG. 1) to provide the polarity variable P thereto. Preferably, the switch 415 includes at least first and second poles and an output for providing the polarity variable P as a function of the switch indication value. As mentioned above, the polarity value P is representative of a high or low data symbol.

Another delay circuit 425 is coupled between the output of the switch 415 and a first pole, pole b, of the switch 415 for delaying the polarity variable P. The delay circuit 425 delays the output P of the switch 415 by one sample in accordance with the signal provided by the PLL 130 and provides the delayed polarity value back to the first pole, pole b, of the switch 415. Additionally, an inverter 420 is coupled between the delay circuit 425 and a second pole, pole a, of the switch 415. According to the present invention, when the output $z_n$ of the exclusive-or gate 410 is equal to zero (0), the switch 415 couples the inverted value provided by the inverter 420 to the signal processor 135 (FIG. 1). When $z_n$ is equal to one (1), the output of the delay circuit 425 is coupled to the signal processor 135. In this manner, a value P representative of the data symbol is provided to the signal processor 135 using simple, relatively inexpensive circuitry.

In addition to providing a less complex, relatively inexpensive way to detect data symbols, another advantage of the present invention is that channel quality can be easily estimated. This can be done, for example, by monitoring the eye opening of the multiplier output signal at the bit centers. A relatively wide eye opening indicates that channel quality is fairly good. This method provides a more reliable result than do conventional received signal strength indicators.

In summary, the radio communication device as described above multiplies the I and Q signal components, then utilizes a polarity detector to generate a high or low signal representative of a high or low data symbol. The polarity detector can be implemented either in software or in hardware capable of performing the equivalent operations. Both hardware and software embodiments of the present invention eliminate the need for various hardware filters and discriminators that are necessary in prior art devices. As a result, the radio communication device can be smaller and less expensive than prior art devices. Additionally, the likelihood of erroneous results because of hardware failure or tolerances is reduced in the radio communication device.

It will be appreciated by now that there has been provided an improved method and apparatus for recovering information transmitted in a radio signal.

What is claimed is:

1. A radio communication device for recovering information from a received signal, the radio communication device comprising:

a demodulator for demodulating the received signal into in-phase (I) and quadrature (Q) components;

a multiplier coupled to the demodulator for multiplying the I and Q components together to generate a multiplied waveform;

a polarity detector coupled to the multiplier for determining from the multiplied waveform a polarity variable indicative of a data symbol;

a processor coupled to the polarity detector for recovering the information from the received signal in accordance with the data symbol; and a correlator coupled to the polarity detector and the processor for providing an indicator of whether the multiplied waveform is inverted, wherein the processor utilizes the indicator along with the polarity variable to determine the data symbol.

2. The radio communication device of claim 1, further comprising:

an alert mechanism for generating an alert responsive to information recovery; and a display for presenting the information.

3. The radio communication device of claim 1, further comprising controls for providing a display command to the processor in response to which the information is presented.

4. A radio communication device for recovering information from a received signal, the radio communication device comprising:

a demodulator for demodulating the received signal into in-phase (I) and quadrature (Q) components;

a multiplier coupled to the demodulator for multiplying the I and Q components together to generate a multiplied waveform;

a polarity detector coupled to the multiplier for determining from the multiplied waveform a polarity variable indicative of a data symbol, wherein the polarity detector comprises:

sampling means for sampling the multiplied waveform to generate a current value;

multiplying means for multiplying the current value with a previous value of the multiplied waveform to generate a multiplied value; and generating means for generating the polarity variable in accordance with the multiplied value; and a processor coupled to the polarity detector for recovering the information from the received signal in accordance with the data symbol.

5. The radio communication device of claim 4, further comprising a phase locked loop for providing a reference signal used by the polarity detector to sample the multiplied waveform.

6. A radio communication device for recovering information from a received signal, the radio communication device comprising:

a demodulator for demodulating the received signal into in-phase (I) and quadrature (Q) components;

a multiplier coupled to the demodulator for multiplying the I and Q components together to generate a multiplied waveform;

a polarity detector coupled to the multiplier for determining from the multiplied waveform a polarity variable indicative of a data symbol, wherein the polarity detector comprises:

a hard limiter for limiting the multiplied waveform to generate a limited output;

a first delay circuit coupled to the hard limiter for delaying the limited output to provide a delayed output;

an exclusive-or gate for receiving the limited output and the delayed output and for generating a switch indication value therefrom;

a switch coupled to the exclusive-or gate for generating the polarity variable as a function of the switch indication value, the switch having a switch output and first and second poles;

a second delay circuit coupled between the switch output and the first pole for delaying the polarity variable; and an inverter coupled between the second delay circuit and the second pole for inverting the polarity variable after it has been delayed, and a processor coupled to the polarity detector for recovering the information from the received signal in accordance with the data symbol.

7. The radio communication device of claim 6, further comprising a phase locked loop coupled to the polarity detector for providing a reference signal used by the polarity detector in sampling the multiplied waveform.

8. A method for recovering information in a radio communication device, comprising the steps of:

demodulating a received signal into in-phase (I) and quadrature (Q) components;

multiplying the I and Q components together to generate a multiplied waveform;

determining from the multiplied waveform a polarity variable indicative of a data symbol; and recovering the information from the received signal in accordance with the data symbol by:

receiving an indicator from a correlator of whether the multiplied waveform is inverted; and determining the data symbol in accordance with the indicator and the polarity variable.

9. The method of claim 8, further comprising the steps of:

generating an alert responsive to information recovery; and presenting the information on a display.

10. The method of claim 8, further comprising the step of:

receiving a user-initiated display command prior to presenting the information.

11. The method of claim 8, wherein the determining step comprises the steps of:

sampling the multiplied waveform to generate a current value;

multiplying the current value with a previous value of the multiplied waveform to generate a multiplied value; and generating the polarity variable in accordance with the multiplied value.

12. The method of claim 11, wherein the determining step further comprises the step of:

referencing an output of a phase locked loop to sample the multiplied waveform.

13. The method of claim 8 wherein the determining step comprises the steps of:

limiting the multiplied waveform to generate a limited output;

delaying the limited output to generate a delayed output;

performing an exclusive-or operation on the delayed output and the limited output to generate a switch indication value; and generating the polarity variable in accordance with the switch indication value.

14. The method of claim 13, wherein the generating step comprises the steps of:

delaying the polarity variable to generate a delayed polarity variable;

inverting the delayed polarity variable to generate an inverted value;

setting the polarity variable to equal the delayed polarity variable when the switch indication value is high; and setting the polarity variable to equal the inverted value when the switch indication value is low.

* * * * *